(12) United States Patent
Chen et al.

(10) Patent No.: US 12,444,714 B2
(45) Date of Patent: *Oct. 14, 2025

(54) SEMICONDUCTOR STRUCTURE

(71) Applicant: Taiwan Semiconductor Manufacturing Company, Ltd., Hsinchu (TW)

(72) Inventors: Hsien-Wei Chen, Hsinchu (TW); Jie Chen, New Taipei (TW); Ming-Fa Chen, Taichung (TW); Ching-Jung Yang, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/472,246

(22) Filed: Sep. 22, 2023

(65) Prior Publication Data
US 2024/0014181 A1      Jan. 11, 2024

Related U.S. Application Data

(60) Continuation of application No. 17/246,692, filed on May 2, 2021, now Pat. No. 11,837,579, which is a division of application No. 16/441,017, filed on Jun. 14, 2019, now Pat. No. 10,998,293.

(51) Int. Cl.
  *H01L 25/065* (2023.01)
  *H01L 23/00* (2006.01)
  *H01L 25/00* (2006.01)

(52) U.S. Cl.
  CPC .......... *H01L 25/0657* (2013.01); *H01L 24/08* (2013.01); *H01L 24/80* (2013.01); *H01L 25/50* (2013.01); *H01L 2224/0224* (2013.01); *H01L 2224/08146* (2013.01); *H01L 2224/80125* (2013.01); *H01L 2224/80895* (2013.01); *H01L 2224/80896* (2013.01); *H01L 2225/06524* (2013.01); *H01L 2225/06593* (2013.01)

(58) Field of Classification Search
  CPC ....... H01L 25/0657; H01L 2224/08146; H01L 2224/80895; H01L 2224/80896
  See application file for complete search history.

(56) References Cited

U.S. PATENT DOCUMENTS

| | | | |
|---|---|---|---|
| 9,911,672 B1 * | 3/2018 | Wu | H01L 21/56 |
| 9,922,964 B1 * | 3/2018 | Chen | H01L 24/09 |
| 11,837,579 B2 * | 12/2023 | Chen | H01L 25/50 |

(Continued)

FOREIGN PATENT DOCUMENTS

| | | |
|---|---|---|
| KR | 20180020849 | 2/2018 |
| TW | 200509331 | 3/2005 |

OTHER PUBLICATIONS

"Office Action of China Counterpart Application", issued on Jul. 30, 2024, p. 1-p. 7.

*Primary Examiner* — Michael Jung
*Assistant Examiner* — Mikka Liu
(74) *Attorney, Agent, or Firm* — JCIPRNET

(57) ABSTRACT

A semiconductor structure includes a first die and a plurality of first dummy pads. The first die includes a first interconnect structure and a first active pad electrically connected to the first interconnect structure. The first dummy pads laterally surround the first active pad and are electrically floating.

20 Claims, 15 Drawing Sheets

(56) References Cited

U.S. PATENT DOCUMENTS

| | | |
|---|---|---|
| 2003/0094634 A1 | 5/2003 | Cho et al. |
| 2011/0248404 A1 | 10/2011 | Chiu et al. |
| 2015/0279816 A1 | 10/2015 | Chen et al. |
| 2016/0093572 A1* | 3/2016 | Chen .................. H01L 23/5389 438/126 |
| 2017/0221859 A1* | 8/2017 | Chen ...................... H01L 21/78 |
| 2017/0250160 A1 | 8/2017 | Wu et al. |
| 2018/0138223 A1* | 5/2018 | Kotoo ................ H01L 27/1469 |

* cited by examiner

SEMICONDUCTOR STRUCTURE

CROSS-REFERENCE TO RELATED APPLICATION

This application is a continuation application of and claims the priority benefit of a prior application Ser. No. 17/246,692, filed on May 2, 2021. The prior application Ser. No. 17/246,692 is a divisional application of and claims the priority benefit of a prior application Ser. No. 16/441,017, filed on Jun. 14, 2019. The entirety of the above-mentioned patent application is hereby incorporated by reference herein and made a part of this specification.

BACKGROUND

In recent years, the semiconductor industry has experienced rapid growth due to continuous improvement in integration density of various electronic components, e.g., transistors, diodes, resistors, capacitors, etc. Such improvement in integration density is mostly attributed to successive reductions in minimum feature sizes, which allows more components to be integrated into a given area.

These smaller electronic components also require smaller packages that occupy less area than previous packages. Some types of packages for semiconductors include quad flat pack (QFP), pin grid array (PGA), ball grid array (BGA), flip chips (FC), three dimensional integrated circuits (3DICs), wafer level packages (WLPs), and package on package (PoP) devices. Some 3DICs are prepared by placing chips over chips on a semiconductor wafer level. 3DICs provide improved integration density and other advantages, such as faster speeds and higher bandwidth, because of the decreased length of interconnects between the stacked chips. However, there are quite a few challenges to be handled for the technology of 3DICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1A:
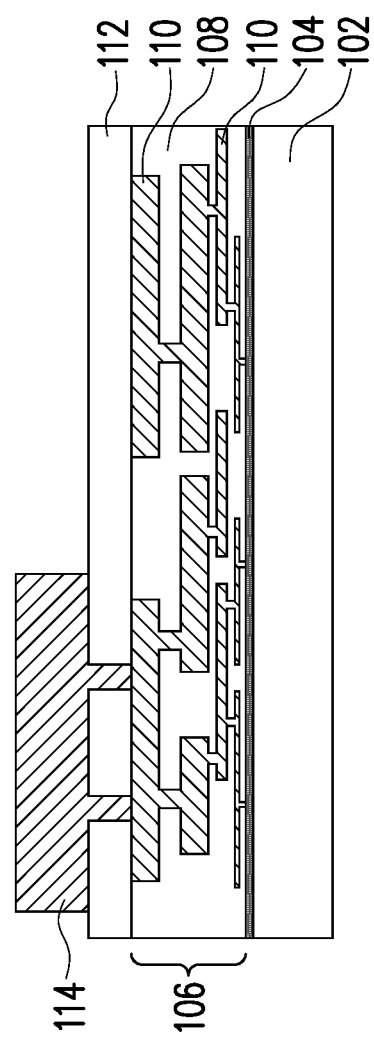
FIG. 1A to FIG. 1E are cross-sectional views of a method of forming a three-dimensional integrated circuit (3DIC) structure in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending over the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1E are cross-sectional views of a method of forming a three-dimensional integrated circuit (3DIC) structure in accordance with some embodiments of the disclosure.

Referring to FIG. 1A, a first die 101 is provided. The first die 101 includes a first semiconductor substrate 102, a first device layer 104, a first interconnect structure 106, a first passivation layer 112, and a first active pad 114, for example. In some embodiments, the first die 101 may be a semiconductor die, a semiconductor chip, a die of a semiconductor wafer or a combination thereof. The first die 101 may be an application-specific integrated circuit (ASIC) chip, an analog chip, a sensor chip, a wireless and radio frequency chip, a voltage regulator chip or a memory chips, for example.

In some embodiments, the first semiconductor substrate 102 may include silicon or other semiconductor materials. Alternatively, or additionally, the first semiconductor substrate 102 may include other elementary semiconductor materials such as germanium. In some embodiments, the first semiconductor substrate 102 is made of a compound semiconductor such as silicon carbide, gallium arsenic, indium arsenide or indium phosphide. In some embodiments, the first semiconductor substrate 102 is made of an alloy semiconductor such as silicon germanium, silicon germanium carbide, gallium arsenic phosphide, or gallium indium phosphide. In some embodiments, the first semiconductor substrate 102 includes an epitaxial layer. For example, the first semiconductor substrate 102 has an epitaxial layer overlying a bulk semiconductor.

In some embodiments, the first device layer 104 is formed over the first semiconductor substrate 102 by a front-end-of-line (FEOL) process. The first device layer 104 includes a wide variety of devices. In some embodiments, the devices include active components, passive components, or a combination thereof. The functions of the devices may include memory, processors, sensors, amplifiers, power distribution, input and/or output circuitry, or the like. In some embodiments, the devices may include integrated circuits devices. The devices are, for example, transistors, capacitors, resistors, diodes, photodiodes, fuse devices, or other similar devices. In some embodiments, the first device layer 104 includes a gate structure, source and drain regions, and isolation structures such as shallow trench isolation (STI) structures (not shown). In the first device layer 104, various N-type metal-oxide semiconductor (NMOS) and/or P-type metal-oxide semiconductor (PMOS) devices, such as transistors or memories and the like, may be formed and interconnected to perform one or more functions.

Referring to FIG. 1A, the first interconnect structure 106 is formed over the first device layer 104. In detail, the first interconnect structure 106 includes a first insulating material 108 and a plurality of first metal features 110. The first metal features 110 are formed in the first insulating material 108 and electrically connected to the first device layer 104. A portion of the first metal features 110, such as topmost first metal features 110, is exposed by the first insulating material 108. In some embodiments, the first insulating material 108 includes an inner-layer dielectric (ILD) layer and at least one inter-metal dielectric (IMD) layer. The ILD layer is disposed over the first device layer 104, and the IMD is disposed over the ILD layer. In some embodiments, the first insulating material 108 includes silicon oxide, silicon oxynitride, silicon nitride, low dielectric constant (low-k) materials or a combination thereof. In some embodiments, the first insulating material 108 may be a single layer or multiple layers. In some embodiments, the first metal features 110 include plugs and metal lines. The plugs may include contacts formed in the ILD layer and vias formed in the IMD layer. The contacts are formed between and in connect with the first device layer 104 and bottommost metal lines. The vias are formed between and in connect with two metal lines. The first metal features 110 may be made of tungsten (W), copper (Cu), copper alloys, aluminum (Al), aluminum alloys, or a combination thereof. In some alternatively embodiments, a barrier layer (not shown) may be formed between the first metal features 110 and the first insulating material 108 to prevent the material of the first metal features 110 from migrating to or diffusion to the first device layer 104. A material of the barrier layer includes tantalum, tantalum nitride, titanium, titanium nitride, cobalt-tungsten (CoW) or a combination thereof, for example. In some embodiments, a thickness of the first metal feature 110 adjacent to the first interconnect structure 106 is less than a thickness of the first metal feature 110 adjacent to the first bonding structure 115 (as shown in FIG. 1D). For example, the thickness of the first metal features 110 directly connected to the first device layer 104 is less than the thickness of the first metal features 110 directly connected to the first active pad 114. However, the invention is not limited thereto.

Referring to FIG. 1A, the first passivation layer 112 is formed over the first interconnect structure 106. In some embodiments, a material of the first passivation layer 112 includes silicon oxide, silicon nitride, benzocyclobutene (BCB) polymer, polyimide (PI), polybenzoxazole (PBO) or a combination thereof, and may be formed by a suitable process such as spin coating, CVD or the like. In some embodiments, the first passivation layer 112 may be a single layer structure, a bilayer structure, or a multilayer structure.

Referring to FIG. 1A, the first active pad 114 is formed over and electrically connected to the first interconnect structure 106. Herein, when elements are described as "active", the elements are functional and electrically connected to other elements of the die. In some embodiments, the first active pad 114 is further extended into the first passivation layer 112, so as to electrically connect to the first metal feature 110. The first active pad 114 and the first metal feature 110 may have the same or different materials. In some embodiments, a material of the first active pad 114 may include a metal material, such as aluminum, copper, nickel, gold, silver, tungsten, or a combination thereof. The first active pad 114 may be formed by forming a via hole to expose the first metal feature 110, depositing a metal material layer to fill in the opening and cover the first passivation layer 112 through a suitable process such as electro-chemical plating process, CVD, atomic layer deposition (ALD), PVD or the like, and then patterning the metal material layer. In some embodiments, a thickness of the first active pad 114 may range from 1 μm to 3 μm, for example.

Figure 1B:
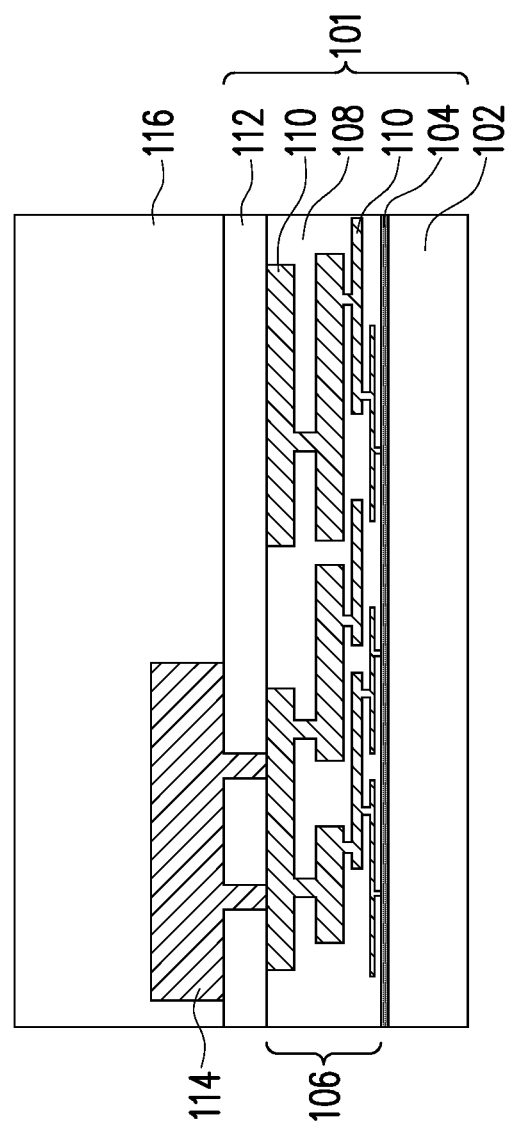

Referring to FIG. 1B, a first bonding dielectric layer 116 is formed over a front side of the first die 101. The first bonding dielectric layer 116 is disposed over the first passivation layer 112 to cover the first active pad 114. In some embodiments, the first bonding dielectric layer 116 covers the top surface and the sidewall of the first active pad 114. In some embodiments, the first bonding dielectric layer 116 includes silicon oxide, silicon nitride, polymer or a combination thereof. The first bonding dielectric layer 116 is formed by a suitable process such as spin coating, CVD or the like. In some embodiments, a thickness of the first bonding dielectric layer 116 may range from 2 μm to 8 μm.

Figure 1C:
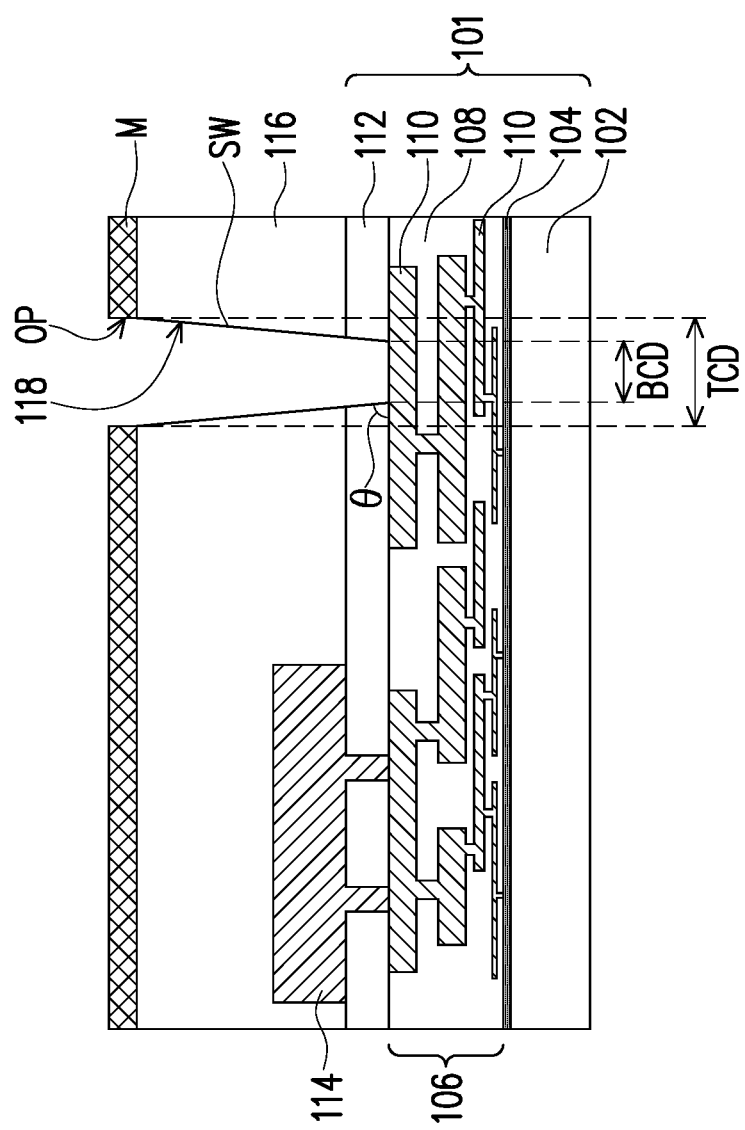
Figure 1D:
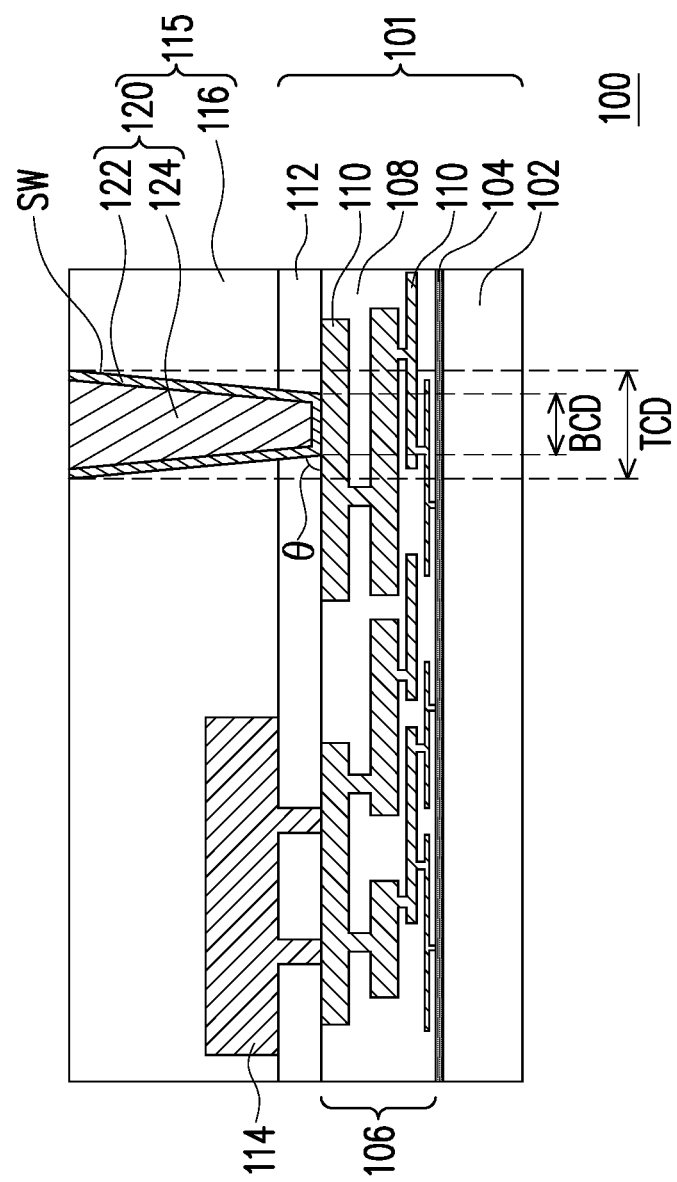

Referring to FIGS. 1C and 1D, a via hole 118 is formed in the first bonding dielectric layer 116, and a first active bonding via 120 is formed in the via hole 118. In some embodiments, the first active bonding via 120 is formed by a single damascene process. First, as shown in FIG. 1C, a mask layer M is formed on the first bonding dielectric layer 116, and the mask layer M has an opening OP to expose a portion of the first bonding dielectric layer 116. Then, by using the mask layer M as a mask, portions of the first bonding dielectric layer 116 and the first passivation layer 112 are removed through a single removal process such as a dry etching process or a wet etching process, so as to expose the first metal feature 110. In some embodiments, the first bonding dielectric layer 116 and the first passivation layer 112 may have similar etching selectivity with respect to an etchant used in the single removal process. In addition, the etching selectivity of the first passivation layer 112 and the first bonding dielectric layer 116 is different from the etching selectivity of the first metal feature 110. Therefore, during the single removal process, the top surface of the first metal feature 110 may be used as an etching stop layer. Accordingly, the via hole 118 penetrates the first passivation layer 112 and the first bonding dielectric layer 116 and stops on the top surface of the first metal feature 110. Then, the mask layer M is removed. In some embodiments, the via hole 118 is integrally formed by a single process, and only one mask is required. Therefore, the cost for forming the via hole 118 may be reduced.

In some embodiments, an entire sidewall SW of the via hole 118 is continuously inclined and formed without a turning point or a step. Accordingly, the via hole 118 may have a substantially smooth sidewall SW. In some embodiments, the sidewall SW may be tapered with respect to the bottom of the via hole 118 and the top surface of the first insulating material 108, for example. In some embodiments, an included angle θ between the sidewall SW and the top surface of the first insulating material 108 may range from 85 degrees to 89.9 degrees, for example. In some embodiments, a difference between a top width TCD and a bottom width BCD of the via hole 118 may be smaller than 5% of the top width TCD, for example. The width TCD of the via hole 118 may range from 2 μm to 10 μm, for example. In some alternative embodiments, the sidewall SW is substantially vertical to the bottom of the via hole 118 and the top surface of the first insulating material 108, and thus the via hole 118 may have a substantially constant width from the top to the bottom.

Then, as shown in FIG. 1D, the first active bonding via 120 is formed in the via hole 118 to electrically connect the first metal feature 110 of the first interconnect structure 106. In some embodiments, the first active bonding via 120 includes a barrier layer 122 and a metal layer 124, for example. The barrier layer 122 is disposed on the sidewall SW and the bottom of the via hole 118, and the metal layer 124 is disposed on the barrier layer 122 and fills into the via hole 118. The barrier layer 122 may include titanium (Ti), tantalum (Ta), titanium nitride (TiN), tantalum nitride (TaN) or a combination thereof, and the metal layer 124 may include tungsten (W), copper (Cu), copper alloys, aluminum (Al), aluminum alloys, or a combination thereof, for example. In some embodiments, the first active bonding via 120 may be formed as follows. First, barrier material is formed on the surface of the first bonding dielectric layer 116 and the sidewall SW and the bottom of the via hole 118. In some embodiments, the barrier material may be formed through a suitable process such as a chemical vapor deposition method, a sputtering method, or a plating method. Then, conductive material is formed on the barrier material and fills into the via hole 118 having the barrier material thereon. The conductive material may be formed through a suitable process such as electro-chemical plating process, CVD, atomic layer deposition (ALD), PVD or the like. After that, the barrier material and the conductive material outside the via hole 118 are removed by a planarization process such as a CMP process, and thus the first active bonding via 120 is formed in the via hole 118.

In some embodiments, the first active bonding via 120 is disposed aside and separated from the first active pad 114, and the first active bonding via 120 is electrically isolated from the first active pad 114. In some embodiments, the first active bonding via 120 is formed as a via, and the first active bonding via 120 penetrates the first passivation layer 112 and the first bonding dielectric layer 116 to electrically connect the first metal feature 110 of the first interconnect structure 106. In some embodiments, the first active bonding via 120 is directly disposed on and in contact with the topmost first metal feature 110 of the first interconnect structure 106. The top surface of the first active bonding via 120 is substantially flush with the top surface of the first bonding dielectric layer 116, and the bottom surface of the first active bonding via 120 is substantially flush with the bottom surface of the first passivation layer 112 and the top surface of the first insulating material 108, for example. In some embodiments, the top surfaces of the barrier layer 122 and the metal layer 124 are substantially coplanar with the top surface of the first bonding dielectric layer 116, and the bottom surface of the barrier layer 122 is substantially coplanar with the bottom surface of the first passivation layer 112 and the top surface of the first insulating material 108, for example. The height of the first active bonding via 120 may be substantially the same as a total thickness of the first passivation layer 112 and the first bonding dielectric layer 116, such as 2 μm to 8 μm.

The first active bonding via 120 has a substantially the same profile as the via hole 118. In detail, an entire sidewall SW of the first active bonding via 120 is continuously inclined and formed without a turning point or a step. That is, the entire sidewall SW of the first active bonding via 120 is substantially smooth. In some embodiments, the sidewall SW of the first active bonding via 120 may be tapered with respect to the bottom of the first active bonding via 120 and the top surface of the first insulating material 108, for example. In some embodiments, an included angle θ between the sidewall SW and the top surface of the first insulating material 108 may range from 85 degrees to 89.9 degrees, for example. In some embodiments, a difference between a top width TCD and a bottom width BCD of the first active bonding via 120 may be smaller than 5% of the top width TCD, for example. The top width TCD of the first active bonding via 120 may range from 2 μm to 10 μm, for example. In some alternative embodiments, the sidewall SW is substantially vertical to the bottom of the first active bonding via 120 and the top surface of the first insulating material 108, and thus the first active bonding via 120 may have a substantially constant width from the top to the bottom.

After forming the first active bonding via 120 in the first bonding dielectric layer 116, a first bonding structure 115 is formed. In some embodiments, as shown in FIG. 1D, a first semiconductor structure 100 is accomplished, the first semiconductor structure 100 includes the first die 101 and the first bonding structure 115 over the first die 101.

Figure 1E:
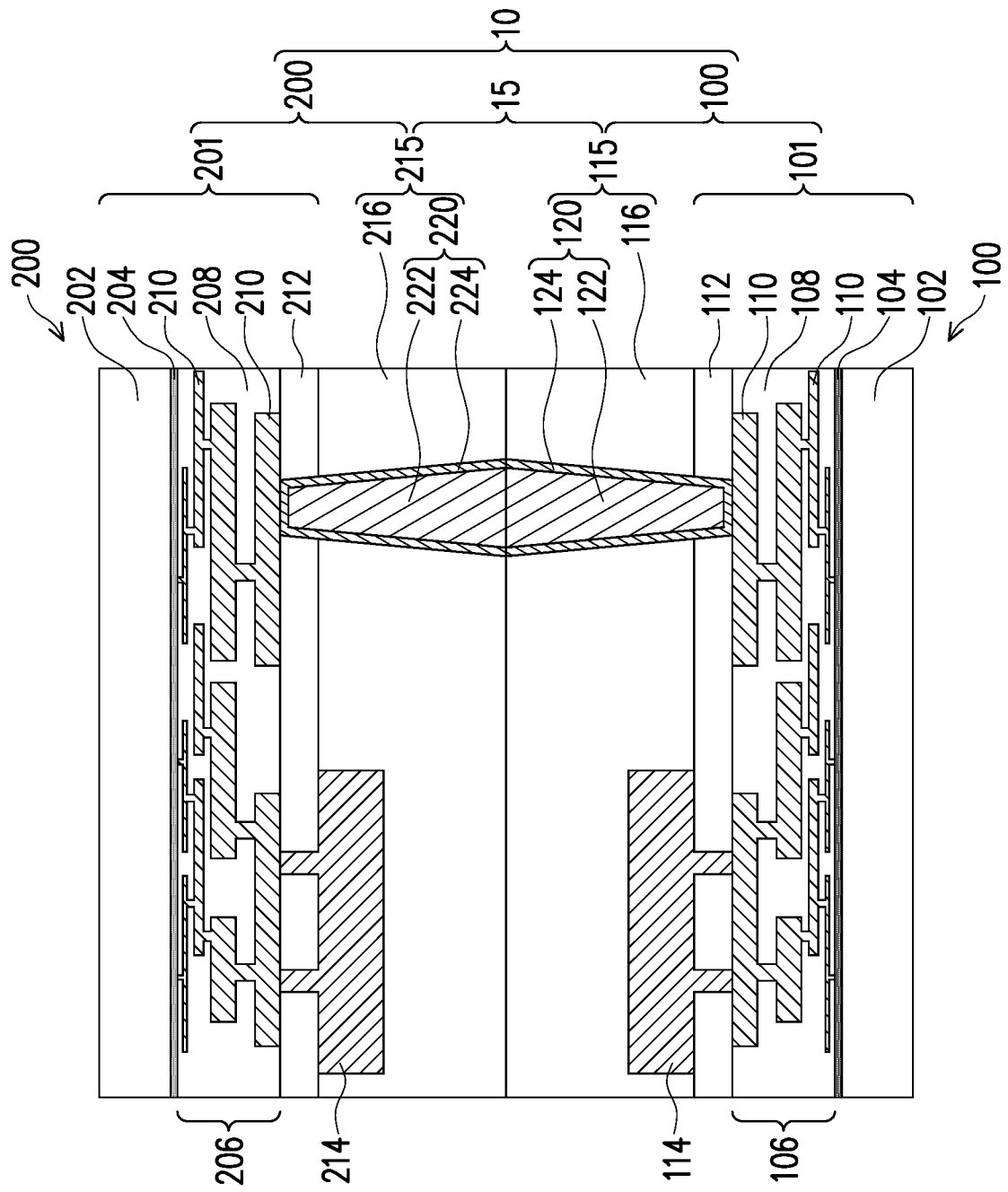

Referring to FIG. 1E, a second semiconductor structure 200 is provided. In detail, the second semiconductor structure 200 includes a second die 201 and a second bonding structure 215 disposed over a front side of the second die 201. In some embodiments, the second semiconductor structure 200 may include a semiconductor die, a semiconductor chip, a semiconductor wafer, or a combination thereof. The second die 201 may be an application-specific integrated circuit (ASIC) chip, an analog chip, a sensor chip, a wireless and radio frequency chip, a voltage regulator chip or a memory chips, for example. The second die 201 and the first die 101 may be the same type of dies or different types of dies.

In some embodiments, the second die 201 is similar to the first die 101. That is, the second die 201 includes a second semiconductor substrate 202, a second device layer 204, a second interconnect structure 206 including a second insulating material 208 and a plurality of second metal features 210, a second passivation layer 212, and a second active pad 214, for example. The arrangement, material and forming method of the second die 201 are similar to the arrangement, material and forming method of the first die 101. Thus, details thereof are omitted here. The first die 101 and the second die 201 illustrated in FIG. 1E have the same size. Herein, the term "size" is referred to the width, length, or area. For example, as shown in FIG. 1E, the width of the second die 201 is equal to the width of the first die 101.

However, the embodiments of the present invention are not limited thereto. In other embodiments, the size of the first die 101 is different from the size of the second die 201. For example, the first die 101 may be a wafer, the second die 201 may be a die and disposed over the wafer as a chip-on-wafer (CoW) structure.

In some embodiments, the second bonding structure 215 is similar to the first bonding structure 115. That is, the second bonding structure 215 includes a second bonding dielectric layer 216 and a second active bonding via 220 in the second bonding dielectric layer 216, and the second active bonding via 220 may have a barrier layer 222 and a metal layer 224. The arrangement, material and forming method of the second bonding structure 215 are similar to the arrangement, material and forming method of the first bonding structure 115. Thus, details thereof are omitted here. The first active bonding via 120 and the second active bonding via 220 illustrated in FIG. 1E have the same size. For example, as shown in FIG. 1E, the width of the second active bonding via 220 is equal to the width of the first active bonding via 120. However, the embodiments of the present invention are not limited thereto. In other embodiments, the size of the first active bonding via 120 is different from the size of the second active bonding via 220. In addition, in some alternative embodiments, the second bonding structure 215 may be different from the first bonding structure 115.

Referring to FIG. 1E, the second semiconductor structure 200 is further turned upside down and mounted onto the first semiconductor structure 100. That is, the first die 101 and the second die 201 are face-to-face bonded together via the first bonding structure 115 and the second bonding structure 215 to form a three-dimensional integrated circuit (3DIC) structure 10 (or referred as a die stack structure). However, the embodiments of the present invention are not limited thereto. In other embodiments, the first die 101 and the second die 201 may be face-to-back bonded together.

In some embodiments, before the first die 101 is bonded to the second die 201, the first bonding structure 115 and the second bonding structure 215 are aligned, so that the first active bonding via 120 may be bonded to the second active bonding via 220, and the first bonding dielectric layer 116 may be bonded to the second bonding dielectric layer 216. In some embodiments, the alignment of the first bonding structure 115 and the second bonding structure 215 may be achieved by using an optical sensing method. After the alignment is achieved, the first bonding structure 115 and the second bonding structure 215 are bonded together by a hybrid bonding to form a hybrid bonding structure 15.

The first bonding structure 115 and the second bonding structure 215 are hybrid bonded together by the application of pressure and heat. It is noted that the hybrid bonding involves at least two types of bonding, including metal-to-metal bonding and non-metal-to-non-metal bonding such as dielectric-to-dielectric bonding or fusion bonding. As shown in FIG. 1E, the hybrid bonding structure 15 includes the first active bonding via 120 and the second active bonding via 220 bonded by metal-to-metal bonding and the first bonding dielectric layer 116 and the second bonding dielectric layer 216 bonded by non-metal-to-non-metal bonding.

Figure 2:
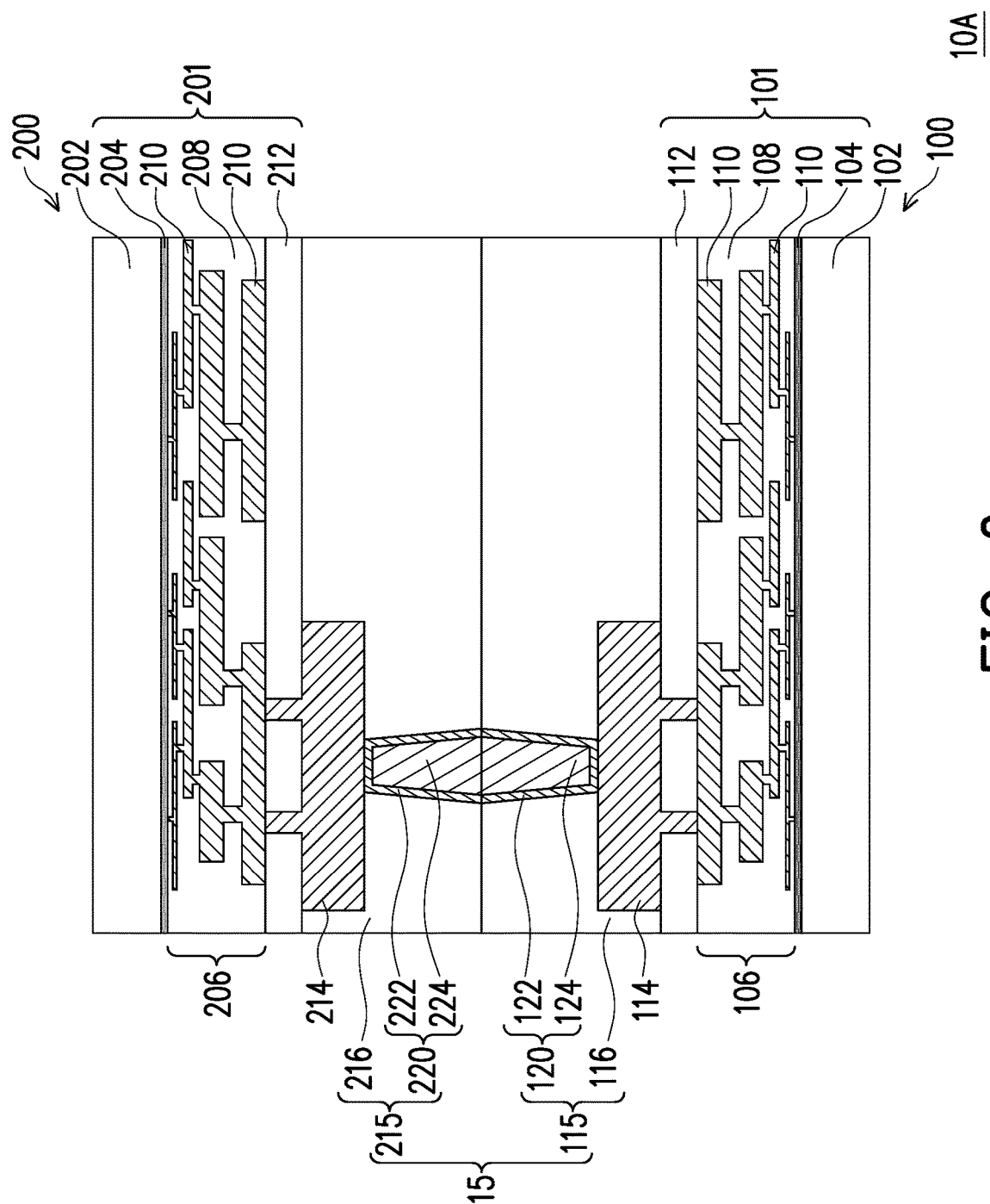
FIG. 2 is a cross-sectional view of a 3DIC structure in accordance with some embodiments of the disclosure.

FIG. 2 is a cross-sectional view of a 3DIC structure in accordance with some embodiments of the disclosure. The 3DIC structure illustrated in FIG. 2 is similar to the 3DIC structure illustrated in FIG. 1E, hence the same reference numerals are used to refer to the same and liked parts, and its detailed description will be omitted herein. The difference between the 3DIC structures of FIGS. 1E and 2 is in the location of the bonding via. For example, in the embodiment shown in FIG. 1E, the bonding via (such as the first and second active bonding vias 120, 220) is designed to directly electrically connect to the interconnect structure (such as the first and second interconnect structures 106, 206). However, in the embodiment shown in FIG. 2, in a 3DIC structure 10A, the first active bonding via 120 is disposed on and electrically connected to the first active pad 114, and further electrically connected to the interconnect structure 106 through the first active pad 114. In some embodiments, the first active bonding via 120 penetrates the first bonding dielectric layer 116 over the first active pad 114 and is in direct contact with the first active pad 114. The height of the first active bonding via 120 may range from 1 μm to 5 μm. The first active bonding via 120 may be formed by a single damascene method. For example, the via hole is formed in the first bonding dielectric layer 116 to expose a portion of the first active pad 114. Then, the first active bonding via 120 is formed in the via hole to electrically connect the first active pad 114. In some embodiments, the second semiconductor structure 200 is similar to the first semiconductor structure 100. However, the invention is not limited thereto.

Figure 3:
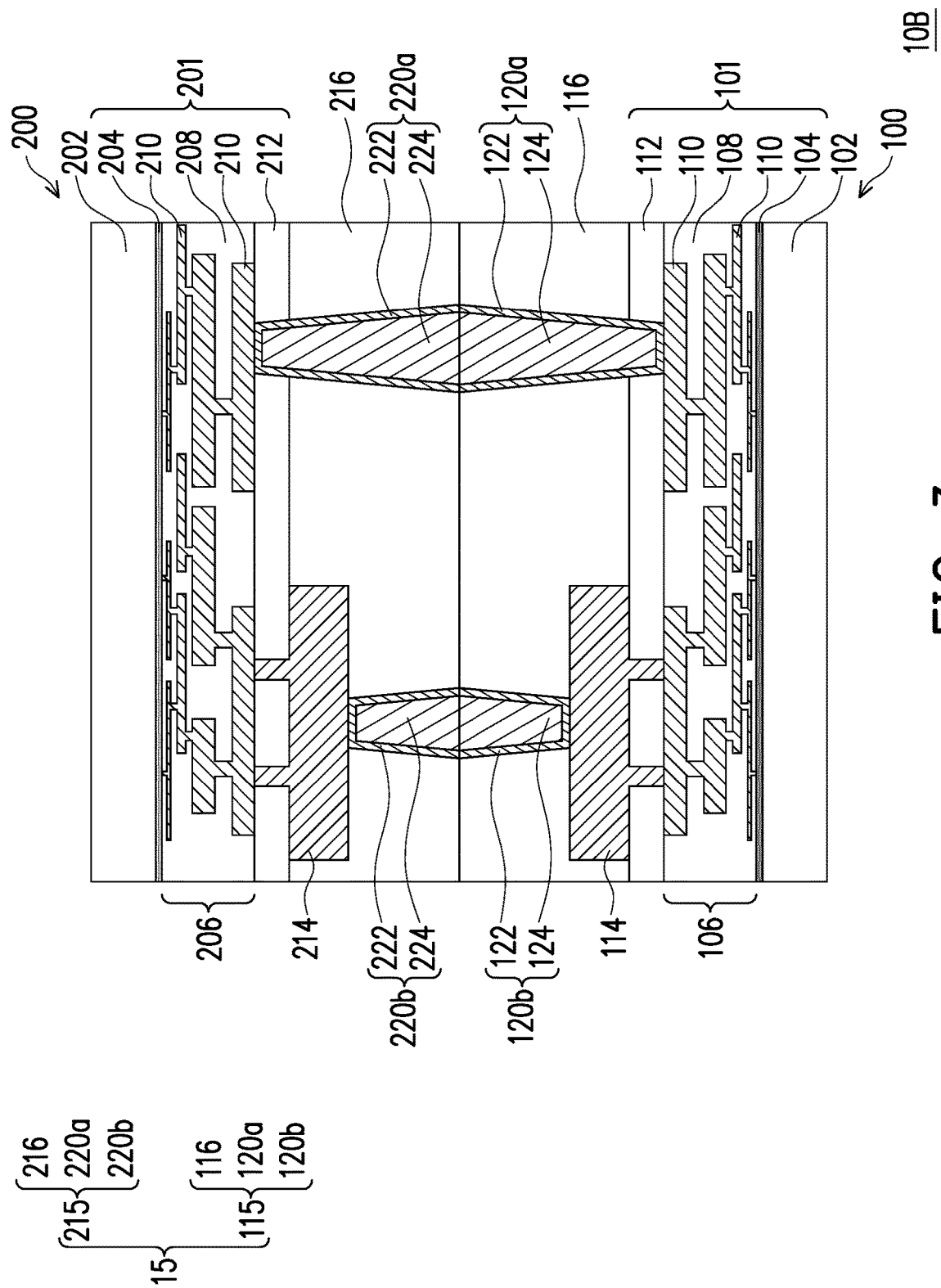
FIG. 3 is a cross-sectional view of a 3DIC structure in accordance with some embodiments of the disclosure.

In some alternative embodiments, as shown in FIG. 3, in a 3DIC structure 10B, the first bonding structure 115 may include a plurality of first active bonding vias 120a, 120b in the first bonding dielectric layer 116. The first active bonding via 120a may be disposed on and directly in contact with the first metal feature 110 of the first interconnector structure 106. The first active bonding via 120b may be disposed on and directly in contact with the first active pad 114. In some embodiments, the height from the top to the bottom of the first active bonding via 120a is larger than the height from the top to the bottom of the first active bonding via 120b. The top surfaces of the first active bonding vias 120a, 120b are substantially flush with the top surface of the first bonding dielectric layer 116. In some embodiments, the first active bonding vias 120a, 120b may be formed simultaneously by using a single damascene method with the same mask. During the single damascene method, the first active pad 114 and the first metal features 110 are used as etching stop layers. In some embodiments, the second bonding structure 215 may be similar to the first bonding structure 115. That is, the second bonding structure 215 may include a plurality of second active bonding vias 220a, 220b in the second bonding dielectric layer 216. The second active bonding via 220a may be disposed on and directly in contact with the second metal feature 210 of the second interconnector structure 206, and the second active bonding via 220b may be disposed on and directly in contact with the second active pad 214, for example. After bonding, the first active bonding vias 120a, 120b may be respectively bonded to the second active bonding vias 220a, 220b. However, the invention is not limited thereto.

FIG. 4A to FIG. 4E are cross-sectional views of a method of forming a 3DIC structure in accordance with some embodiments of the disclosure. FIG. 5 is a top view showing a structure of FIG. 4D in which the first bonding dielectric layer 116 is omitted. The steps illustrated in FIG. 4A to FIG. 4E are similar to the steps illustrated in FIG. 1A to FIG. 1E, hence the same reference numerals are used to refer to the same and liked parts, and its detailed description will be omitted herein. The difference between the steps of FIG. 4A to FIG. 4E and FIG. 1A to FIG. 1E is in the formation of dummy elements and described below.

Figure 4A:
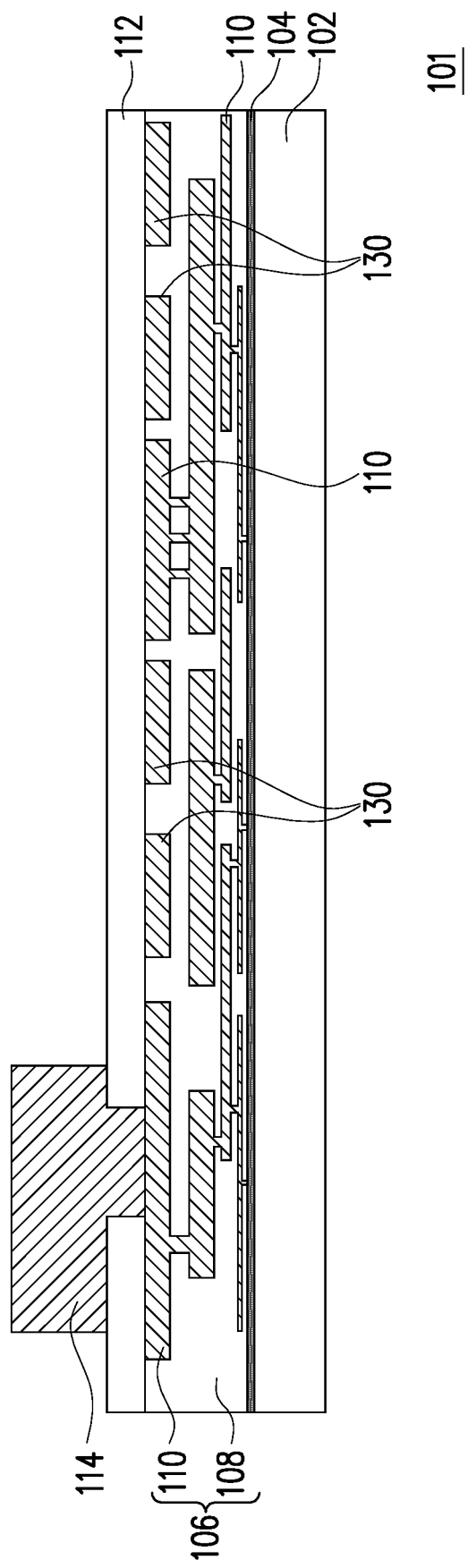
FIG. 4A to FIG. 4E are cross-sectional views of a method of forming a 3DIC structure in accordance with some embodiments of the disclosure.
Figure 5:
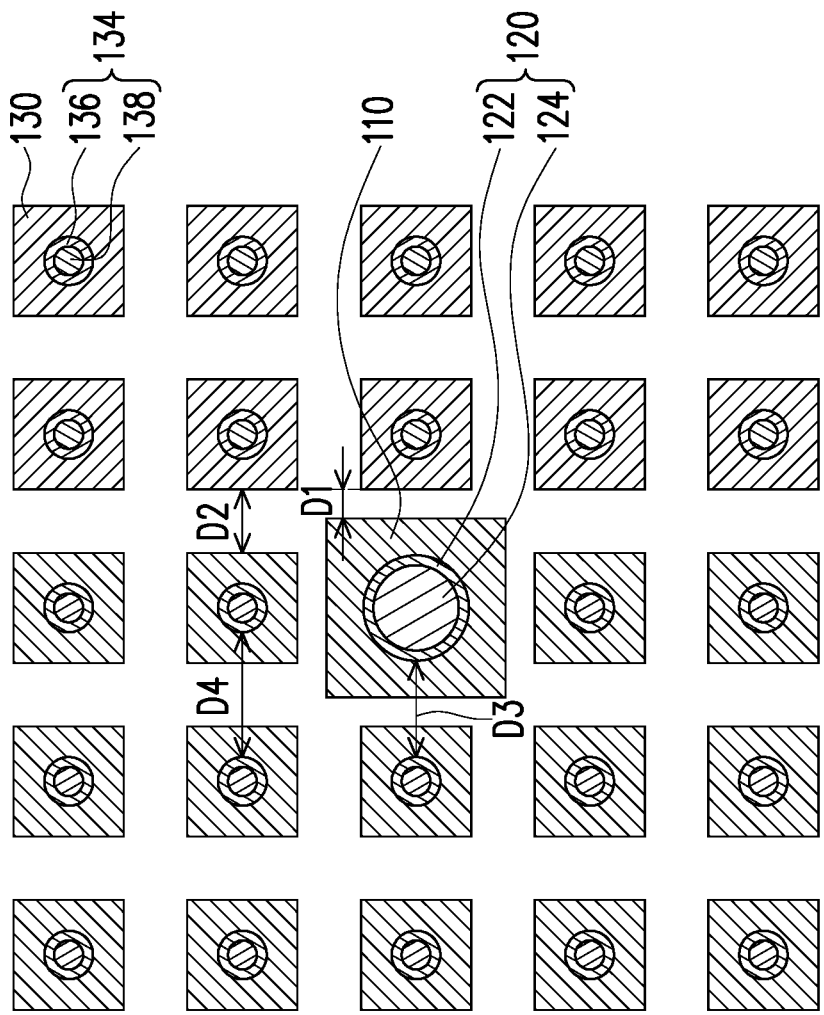
FIG. 5 is a top view showing a structure of FIG. 4D.
Figure 5:
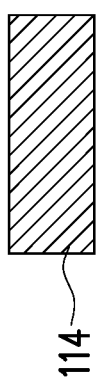

Referring to FIG. 4A, a first die 101 is provided. In some embodiments, the first die 101 includes a first semiconductor substrate 102, a first device layer 104, a first interconnect structure 106, a plurality of first dummy features 130, a first passivation layer 112, and a first active pad 114, for example. In some embodiments, the first dummy features 130 are formed aside first metal features 110 of the first interconnect structure 106. Herein, when elements are described as "dummy", the elements are electrically floating or electrically isolated from other elements. For example, as shown in FIG. 4A, the first dummy features 130 are electrically floating.

In some embodiment, the first dummy features 130 and the topmost first metal features 110 are at substantially the same level. That is, tops of the first dummy features 130 and the topmost first metal features 110 are substantially coplanar with the top surface of the first insulating material 108. In some embodiments, the material of the first dummy features 130 and the material of the first metal features 110 may be the same. In some alternatively embodiments, the material of the first dummy features 130 may be different from the material of the first metal features 110. In some embodiments, the first dummy features 130 and the first metal features 110 are formed at the same time by using the same mask. In some alternative embodiments, the first dummy features 130 and the first metal features 110 are successively formed. In some embodiments, a width of the first dummy feature 130 may be smaller than a width of the topmost first metal feature 110, for example. However, in some alternative embodiments, a width of the first dummy feature 130 may be substantially the same or larger than a width of the topmost first metal feature 110.

In some embodiments, as shown in FIG. 5, the first dummy features 130 and one of the topmost first metal features 110 may be arranged in array, and the first dummy features 130 surround the topmost first metal feature 110, for example. That is, the topmost first metal feature 110 may be disposed in the center of the array. In some embodiments, the distance D1 between the first dummy feature 130 and the topmost first metal feature 110 may be less than the distance D2 between the first dummy features 130 in a direction (for example, x direction or y direction). However, the invention is not limited thereto. In some embodiments, the aforementioned distance D1 may range from 3 μm to 10 μm, for example.

Figure 4B:
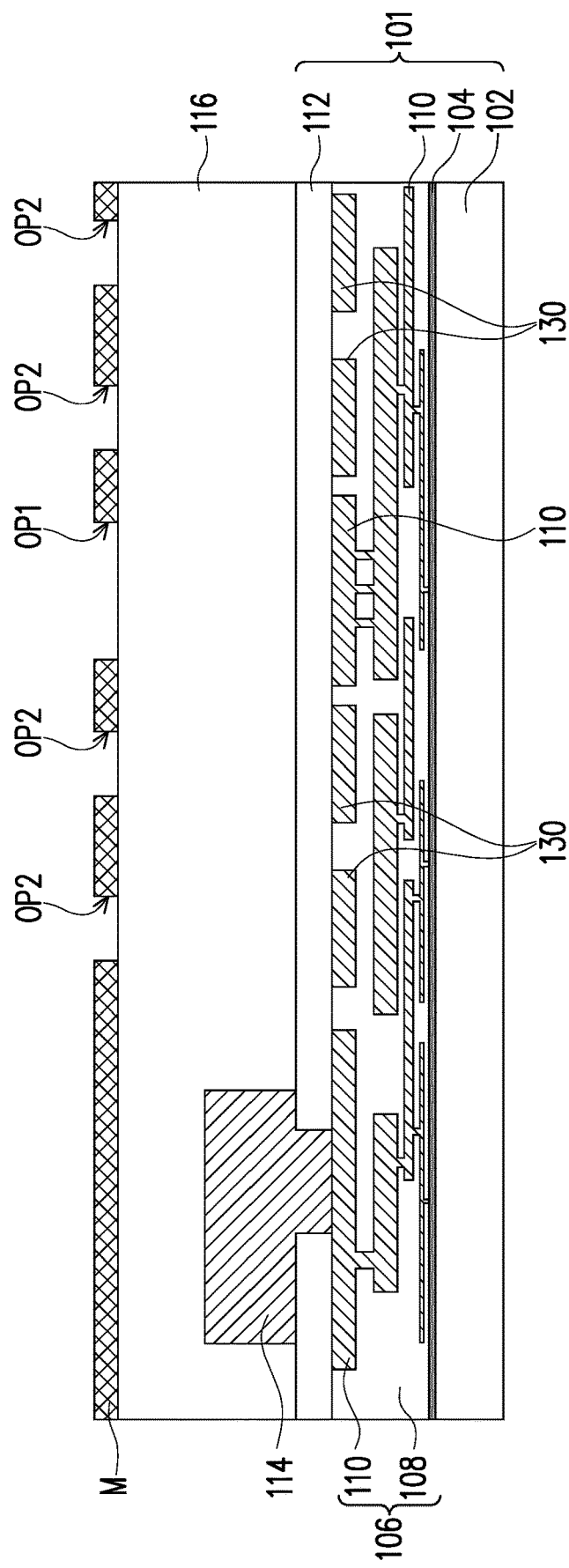

Referring to FIG. 4B, a first bonding dielectric layer 116 is formed over a first die 101. Then, a mask layer M is formed over the first bonding dielectric layer 116, and the mask layer M includes a plurality of openings OP1, OP2. The openings OP1, OP2 expose the first bonding dielectric layer 116. In some embodiments, the opening OP1 is disposed corresponding to the topmost first metal feature 110, and the openings OP2 are disposed corresponding to the first dummy features 130.

Figure 4C:
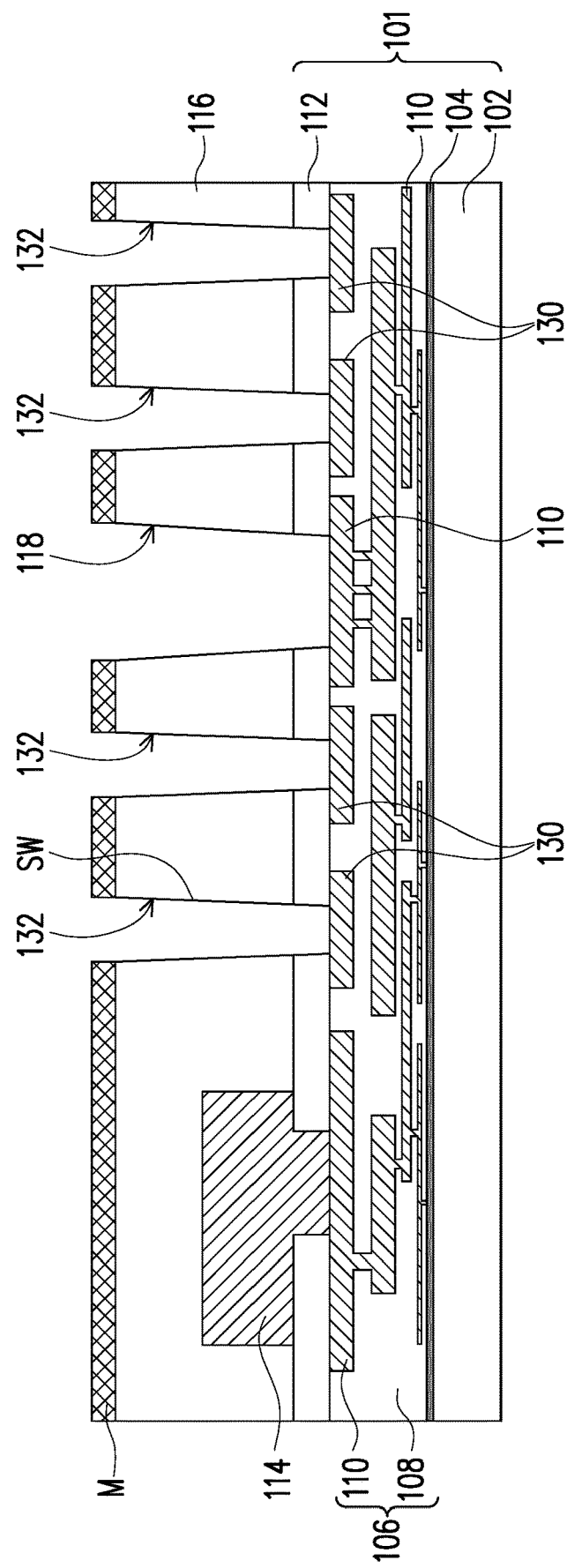

Referring to FIG. 4C, a via hole 118 and a plurality of dummy via holes 132 are formed in the first bonding dielectric layer 116 and the first passivation layer 112. In some embodiments, by using the mask layer M as a mask, portions of the first bonding dielectric layer 116 and the first passivation layer 112 exposed by the openings OP1, OP2 are removed, so as to form the via hole 118 and the dummy via holes 132. In other words, the via hole 118 and the dummy via holes 132 may be simultaneously formed by using the same mask and a single removal process. Since the etching selectivity of the topmost first metal feature 110 and the first dummy features 130 is similar and different from the etching selectivity of the first bonding dielectric layer 116 and the first passivation layer 112, the removal process may stop at the tops of the topmost first metal feature 110 and the first dummy features 130. Then, the mask layer M is removed. In some embodiments, the via hole 118 exposes the topmost first metal feature 110, and the dummy via holes 132 respectively expose the first dummy features 130, for example. In some embodiments, similar to the via hole 118 described in the aforementioned embodiments, an entire sidewall SW of the dummy via hole 132 is continuously inclined and formed without a turning point or a step. Accordingly, the dummy via hole 132 may have a substantially smooth sidewall SW. In some embodiments, the sidewall SW of the dummy via hole 132 may be tapered with respect to the bottom of the dummy via hole 132 and the bottom surface of the first passivation layer 112, for example. In some embodiments, a width of the dummy via hole 132 may be smaller than a width of the via hole 118, for example. However, in some alternative embodiments, a width of the dummy via hole 132 may be substantially the same or larger than a width of the via hole 118.

Figure 4D:
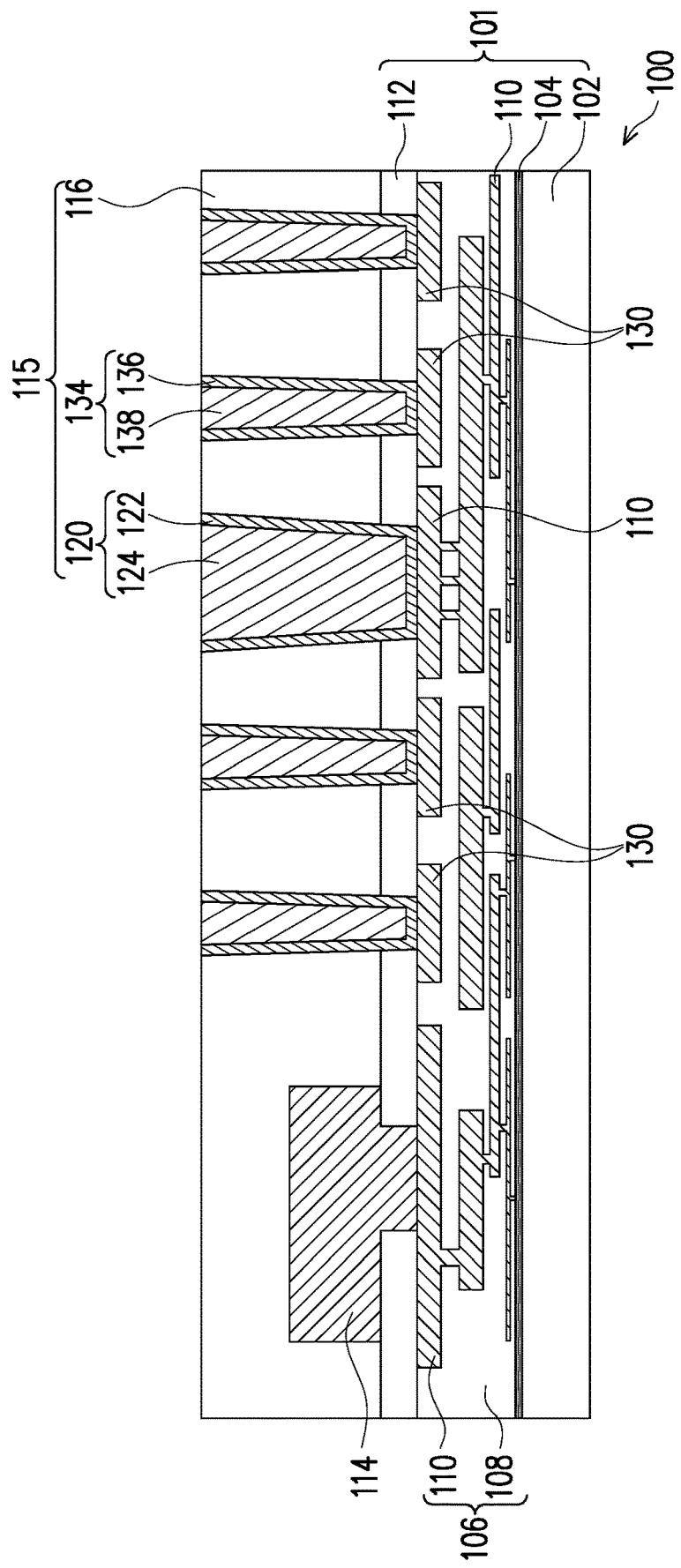

Referring to FIG. 4D, a first active bonding via 120 and a plurality of first dummy bonding vias 134 are respectively formed in the via hole 118 and the dummy via holes 132. In some embodiments, the first dummy bonding vias 134 may be formed simultaneously with the first active bonding via 120, and thus the first dummy bonding vias 134 may have similar, substantially the same or the same configuration of the first active bonding via 120. For example, in some embodiments, the first active bonding via 120 may have a barrier layer 122 and a metal layer 124, and the first dummy bonding via 134 may have a barrier layer 136 and a metal layer 138. In some embodiments, a method of forming the first active bonding via 120 and the first dummy bonding vias 134 may include the following steps. First, barrier material is formed over the exposed surfaces of the first bonding dielectric layer 116, the via hole 118 and the dummy via holes 132. Then, metal material is formed over the top surface of the barrier material and fills into the via hole 118 and the dummy via holes 132. After that, the barrier material and the conductive material outside the via hole 118 and the dummy via holes 132 are removed by a planarization process such as a CMP process, and the first active bonding via 120 and the first dummy bonding vias 134 are formed respectively in the via hole 118 and the dummy via holes 132. In some embodiments, the first active bonding via 120 and the first dummy bonding vias 134 are formed by a single damascene process with the same mask. In some embodiments, similar to the first active bonding via 120 described in the aforementioned embodiments, an entire sidewall SW of the first dummy bonding via 134 is continuously inclined and formed without a turning point or a step. Accordingly, the first dummy bonding via 134 may have a substantially smooth sidewall SW. In some embodiments, the sidewall SW of the first dummy bonding via 134 may be tapered with respect to the bottom of the via hole 118 and the bottom surface of the first passivation layer 112, for example.

In some embodiments, as shown in FIGS. 4D and 5, the first active bonding via 120 is disposed on and electrically connected to the topmost first metal feature 110 of the first interconnect structure 106, and the first dummy bonding vias 134 are respectively disposed on the first dummy features 130 and electrically isolated from the first interconnect structure 106. In some embodiments, the first dummy bonding vias 134 may be electrically connected to the first dummy features 130 which are electrically floating. In some embodiments, the width of the first dummy bonding via 134 may be smaller than a width of the first active bonding via 120, for example. However, in some alternative embodiments, a width of the first dummy bonding via 134 may be substantially the same or larger than a width of the first active bonding via 120.

In some embodiments, as shown in FIG. 5, the first dummy bonding vias 134 and the first active bonding via 120 may be arranged in array, and the first dummy bonding vias 134 surrounds the first active bonding via 120, for example. That is, the first active bonding via 120 may be disposed in the center of the array. In some embodiments, the distance D3 between the first dummy bonding via 134 and the first active bonding via 120 may be less than as the distance D4 between the first dummy bonding vias 134 in a direction (for example, x direction or y direction). However, the invention is not limited thereto. In some embodiments, the aforementioned distance D3 may range from 1 μm to 8 μm, for example. In some embodiments, by designing the first dummy bonding vias 134 aside the first active bonding via 120, the loading effect of the planarization process during the formation of the first active bonding via 120 may be reduced.

After forming the first active bonding via 120 and the first dummy bonding vias 134 in the first bonding dielectric layer 116, a first bonding structure 115 is formed. In some embodiments, as shown in FIG. 4D, a first semiconductor structure 100 is accomplished, the first semiconductor structure 100 includes the first die 101 and the first bonding structure 115.

Figure 4E:
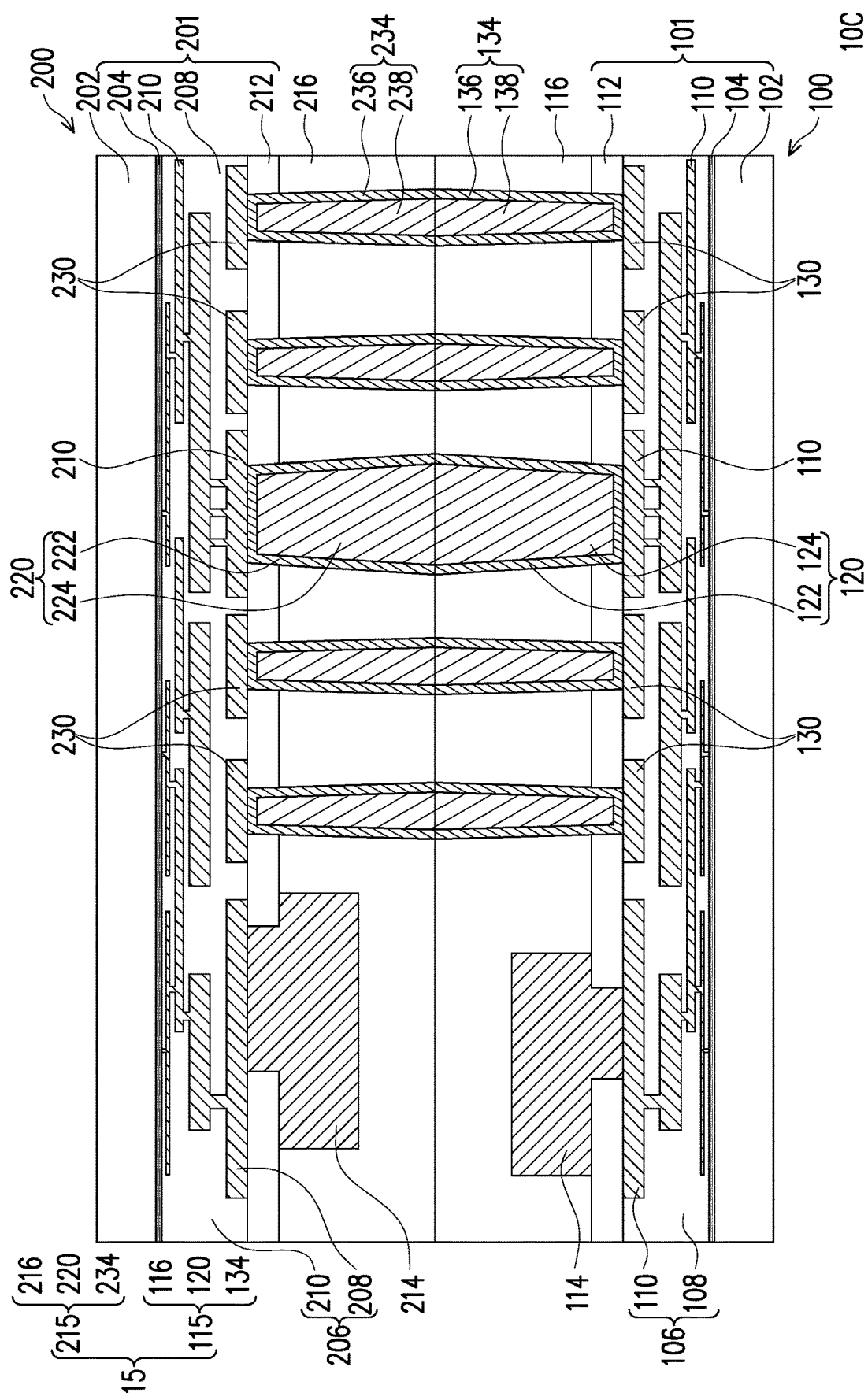

Referring to FIG. 4E, a second semiconductor structure 200 is provided and bonded to the first semiconductor structure 100 of FIG. 4D. In some embodiments, the second semiconductor structure 200 includes a second die 201 and a second bonding structure 215. In some embodiments, the second die 201 may be similar to the first die 101, and the second bonding structure 215 may be similar to the first bonding structure 115. For example, second dummy bonding vias 234 are respectively disposed on and electrically connected to second dummy features 230, and a second active bonding via 220 is disposed on and electrically connected to a topmost second metal feature 210. In some embodiments, the second dummy bonding via 234 may have a barrier layer 236 and a metal layer 238.

In some embodiments, the first die 101 and the second die 201 are bonded together by a hybrid bonding to form a 3DIC structure 10C. In some embodiments, as shown in FIG. 4E, a hybrid bonding structure 15 includes the first active bonding via 120 and the second active bonding via 220 and the first dummy bonding via 134 and the second dummy bonding via 234 bonded by metal-to-metal bonding and the first bonding dielectric layer 116 and the second bonding dielectric layer 216 bonded by non-metal-to-non-metal bonding.

Figure 6A:
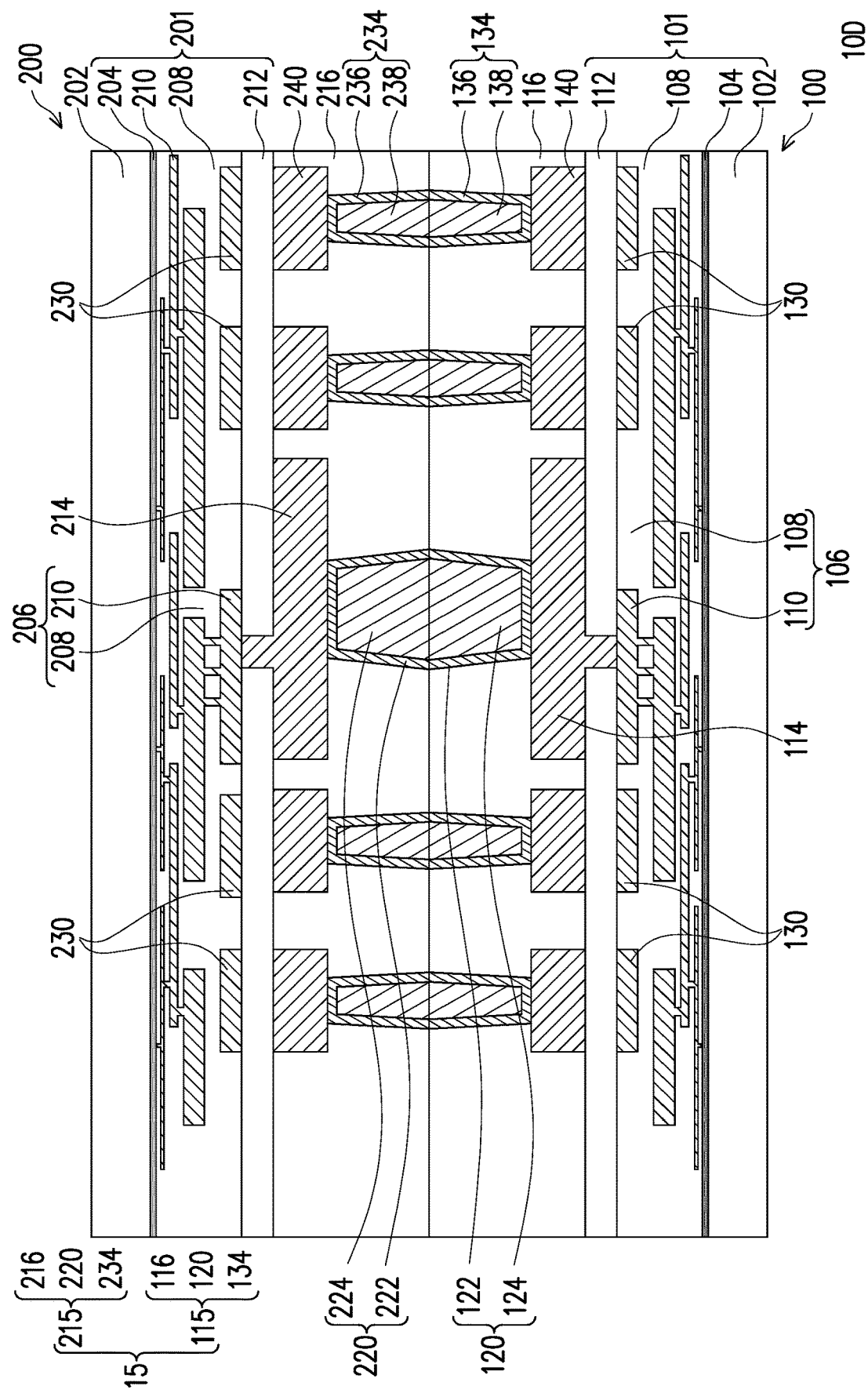
FIG. 6A is a cross-sectional view of a 3DIC structure in accordance with some embodiments of the disclosure.
Figure 6B:
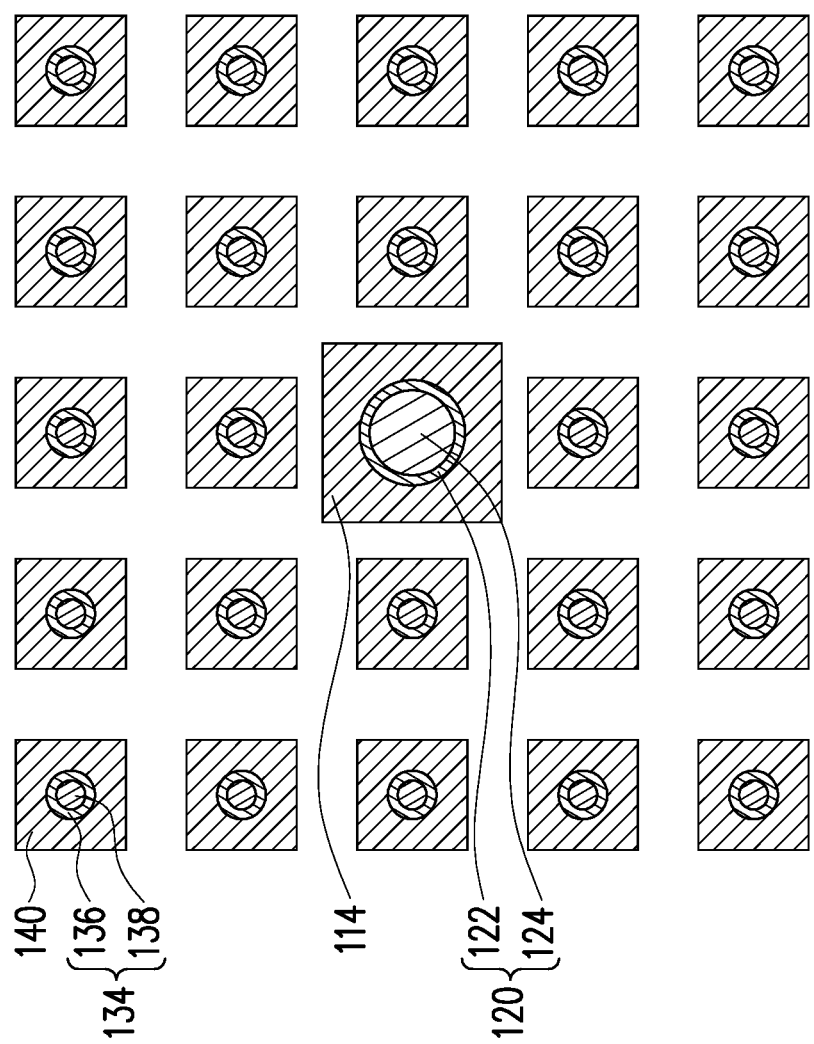
FIG. 6B is a top view of a first bonding via, a first dummy bonding via, a first pad and a first dummy pad in the 3DIC structure.

FIG. 6A is a cross-sectional view of a 3DIC structure in accordance with some embodiments of the disclosure, and FIG. 6B is a top view of a first bonding via, a first dummy bonding via, a first pad and a first dummy pad in the 3DIC structure. The 3DIC structure illustrated in FIG. 6A and FIG. 6B is similar to the 3DIC structure illustrated in FIG. 4E and FIG. 5, hence the same reference numerals are used to refer to the same and liked parts, and its detailed description will be omitted herein. The difference between the 3DIC structures of FIG. 6A and FIG. 6B and FIG. 4E and FIG. 5 is in the location of the bonding via and formation of the dummy pad. For example, in the embodiment shown in FIG. 4E and FIG. 5, the bonding via (such as the first and second active bonding vias 120, 220) and the dummy bonding vias (such as the first and second first dummy bonding vias 134, 234) are designed to electrically connect to the interconnect structure (such as the first and second interconnect structures 106, 206) and the dummy features (such as the first and second dummy features 130, 230). However, in the embodiment shown in FIG. 6A and FIG. 6B, in a 3DIC structure 10D, the first semiconductor structure 100 further includes a plurality of first dummy pads 140 aside the first active pad 114. The first active pad 114 is electrically connected to the first interconnector structure 106 while the first dummy pads 140 are electrically floating and isolated from the first die 101. In some embodiment, the first dummy pads 140 and the first active pad 114 are at substantially the same level. That is, tops of the first dummy pads 140 and the first active pad 114 are substantially coplanar with each other. In some alternative embodiments, the dummy features 130 may be omitted.

In some embodiments, the first active bonding via 120 is disposed on and electrically connected to the first active pad 114, and the first dummy bonding vias 134 are respectively disposed on the first dummy pads 140 and electrically isolated from the first die 101. In some embodiments, a material of the first dummy pads 140 may include a metal material, such as aluminum, copper, nickel, gold, silver, tungsten, or a combination thereof. In some embodiments, the material of the first dummy pads 140 may have the etching selectivity similar to a material of the first active pad 114 with respect to an etchant used in the formation process of the via holes for the first active bonding via 120 and the first dummy bonding vias 134. In some embodiments, the first dummy pads 140 and the first active pad 114 are formed at the same time. In some alternative embodiments, the first dummy pads 140 and the first active pad 114 are successively formed. In some embodiments, a width of the first dummy pads 140 may be smaller than a width of the first active pad 114, for example. However, in some alternative embodiments, a width of the first dummy pads 140 may be substantially the same or larger than a width of the first active pad 114.

In some embodiments, as shown in FIG. 6B, the first dummy pads 140 and the first active pad 114 may be arranged in array, and the first dummy pads 140 surround the first active pad 114, for example. That is, the first active pad 114 may be disposed in the center of the array. In some embodiments, the distance between the first dummy pad 140 and the first active pad 114 may be substantially less than the distance between the first dummy pads 140. However, the invention is not limited thereto. In some embodiments, the distance between the first dummy pad 140 and the first active pad 114 may range from 1 μm to 8 μm, for example. In some embodiments, the second semiconductor structure 200 is similar to the first semiconductor structure 100. That is, the second semiconductor structure 200 has a plurality of second dummy pads 240 and a plurality of second dummy bonding vias 234 thereon. However, the invention is not limited thereto. In some embodiments, as shown in FIG. 6A, the hybrid bonding structure 15 includes the first active bonding via 120 and the second active bonding via 220 and the first dummy bonding via 134 and the second dummy bonding via 234 bonded by metal-to-metal bonding and the first bonding dielectric layer 116 and the second bonding dielectric layer 216 bonded by non-metal-to-non-metal bonding.

In some embodiments, the bonding via penetrating the bonding dielectric layer is formed by a single damascene method. In other words, the via hole for the bonding via is formed by a single removal process with only one mask. Therefore, compared with the conventional conductive bonding structure including the bonding via and the bonding pad thereon, the process and the mask for forming the bonding pad are not required. Accordingly, the process for forming the bonding structure is simplified and the cost thereof is reduced. Additionally, in some embodiments, in order to improve the process control, a plurality of dummy bonding vias may be formed aside the bonding via. Furthermore, a plurality of dummy elements such as dummy features or dummy pads may be formed below the dummy bonding vias and used as etching stop layers during the formation of the dummy bonding vias. In some embodiments, the dummy bonding vias may be formed simultaneously with the bonding via by using the same mask, and thus the time and the cost are not significantly increased.

According to some embodiments, a method of manufacturing a semiconductor structure includes the following steps. A first die is provided, wherein the first die comprises a first substrate, a first interconnect structure over the first substrate, and a first pad disposed over and electrically connected to the first interconnect structure. A first bonding dielectric layer is formed over the first die to cover the first die. By using a single damascene process, a first bonding via penetrating the first bonding dielectric layer is formed, to electrically connect the first interconnect structure.

According to some embodiments, a method of manufacturing a semiconductor structure includes the following steps. A first die is formed, wherein the first die comprises a first substrate, a first interconnect structure over the first substrate, and a first active pad disposed over and electrically connected to the first interconnect structure. A first bonding dielectric layer is formed over the first die to cover the first die. By using a single removal process, a via hole and at least one dummy via hole respectively penetrating the bonding dielectric layer are formed. A first active bonding via and at least one first dummy bonding via are respectively formed in the via hole and the at least one dummy via hole, wherein the first active bonding via is electrically connected to the first interconnect structure, and the at least one first dummy bonding via is electrically floating.

According to some embodiments, a semiconductor structure is provided and includes a first die and a second die. The first die has a first active bonding via in a first bonding dielectric layer thereon. The second die has a second active bonding via in a second bonding dielectric layer thereon. The first die and the second die are bonded through bonding the first and second active bonding vias together and bonding the first and second bonding dielectric layers together. The first active bonding via penetrates the first bonding dielectric layer, and the first active bonding via has a continuously inclined sidewall from a top to a bottom of the first active bonding via.

According to some embodiments, a semiconductor structure includes: a first die, comprising a first interconnect structure and a first active pad electrically connected to the first interconnect structure; a first bonding dielectric layer over the first die; a first active bonding via in the first bonding dielectric layer, electrically connected to the first interconnect structure; and a plurality of first dummy bonding vias in the first bonding dielectric layer, wherein the first dummy bonding vias laterally surround the first active bonding via and are electrically floating.

According to some embodiments, a semiconductor structure includes: a first die, comprising a first interconnect structure and a first active pad electrically connected to the first interconnect structure; a first bonding dielectric layer over the first die; at least one first dummy pad aside the first active pad in the first bonding dielectric layer, electrically isolated from the first interconnect structure; and a first active bonding via and at least one first dummy bonding via in the first bonding dielectric layer, wherein the first active bonding via is electrically connected to the first active pad, and the at least one first dummy bonding via is electrically floating.

According to some embodiments, a semiconductor structure includes: a first die and a second die; at least one first active bonding via and a plurality of first dummy bonding vias over the first die, wherein the first dummy bonding vias laterally surround the at least one first active bonding via and are electrically floating; and at least one second active bonding via and a plurality of second dummy bonding vias over the second die, wherein the at least one second active bonding via is bonded to the at least one first active bonding via, and the second dummy bonding vias are bonded to the first dummy bonding vias respectively.

According to some embodiments, a semiconductor structure includes a first die and a plurality of first dummy pads. The first die includes a first interconnect structure and a first active pad electrically connected to the first interconnect structure. The first dummy pads laterally surround the first active pad and are electrically floating.

According to some embodiments, a semiconductor structure includes a first die and a first active bonding via. The first die includes a substrate, a first interconnect structure and a first active pad electrically connected to the first interconnect structure, wherein the first interconnect structure is disposed between the substrate and the first active pad, and the first active pad is disposed between the first interconnect structure and the first active bonding via. The first active bonding via is electrically connected to the first active pad.

According to some embodiments, a semiconductor structure includes a first die, a second die, at least one first active bonding via and a plurality of first dummy bonding vias. The first active bonding via and the first dummy bonding vias are disposed between the first die and the second die, wherein the first dummy bonding vias laterally surround the at least one first active bonding via and are electrically floating.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a first die, comprising a first interconnect structure and a first active pad electrically connected to the first interconnect structure; a first active bonding via, wherein the first active pad has a first surface facing the first interconnect structure and a second surface opposite to the first surface, the first active bonding via has a third surface facing the first interconnect structure and a fourth surface opposite to the third surface, and the second surface of the first active pad is disposed between the third surface and the fourth surface of the first active bonding via; and
a first bonding dielectric layer, covering the second surface of the first active pad and laterally encapsulating sidewalls of the first active pad and the first active bonding via, wherein the first bonding dielectric layer is a single layer.

2. The semiconductor structure according to claim 1, wherein the first active bonding via is electrically connected to the first interconnect structure and electrically isolated from the first active pad.

3. The semiconductor structure according to claim 1, further comprising a plurality of first dummy pads and a plurality of first dummy bonding vias connected to the first dummy pads respectively, wherein the first dummy pads laterally surround the first active pad and are electrically floating.

4. The semiconductor structure according to claim 3, wherein a width of the first active bonding via is larger than a width of one of the first dummy bonding vias.

5. The semiconductor structure according to claim 3, wherein the third surface of the first active bonding via is substantially coplanar with first surfaces of the first dummy bonding vias, and the fourth surface of the first active bonding via is substantially coplanar with second surfaces opposite to the first surfaces of the first dummy bonding vias.

6. The semiconductor structure according to claim 1, wherein the first surface of the first active pad is substantially coplanar with a surface of the first bonding dielectric layer.

7. A semiconductor structure, comprising:
a first die, comprising a substrate, a first interconnect structure, a first active pad electrically connected to the first interconnect structure, a first active bonding via electrically connected to the first active pad, wherein the first interconnect structure is disposed between the substrate and the first active pad, and the first active pad is disposed between the first interconnect structure and the first active bonding via; and
a plurality of first dummy bonding pads surrounding the first active pad, wherein the first dummy bonding pads are electrically floating.

8. The semiconductor structure according to claim 7, further comprising a first bonding dielectric layer over the first die, wherein the first active bonding via is disposed in the first bonding dielectric layer.

9. The semiconductor structure according to claim 7, wherein the first active bonding via is in direct contact with the first active pad.

10. The semiconductor structure according to claim 7, further comprising a plurality of first dummy bonding vias surrounding the first active bonding via, wherein the first dummy bonding vias are electrically floating.

11. The semiconductor structure according to claim 10, wherein the first dummy bonding vias and the first active bonding via are disposed in a first bonding dielectric layer.

12. The semiconductor structure according to claim 7, wherein a surface of the first active pad is substantially coplanar with surfaces of the first dummy bonding pads.

13. The semiconductor structure according to claim 7, further comprising a plurality of first dummy bonding vias, wherein the first dummy bonding pads are respectively disposed between the first interconnect structure and the first dummy bonding vias.

14. A semiconductor structure, comprising:
a first die and a second die;
at least one first active bonding via and a plurality of first dummy bonding vias between the first die and the second die, wherein the first dummy bonding vias laterally surround the at least one first active bonding via and are electrically floating;
at least one first active pad electrically connected to the at least one first active bonding via; and
at least one second active bonding via bonded to the at least one first active bonding via, wherein the at least one first active bonding via is physically connected to the at least one first active pad, the at least one first active pad has a first width along a first direction, and the at least one first active bonding via has a second width smaller than the first width along the first direction.

15. The semiconductor structure according to claim 14, further comprising a plurality of second dummy bonding vias between the first die and the second die, wherein the second dummy bonding vias are bonded to the first dummy bonding vias respectively.

16. The semiconductor structure according to claim 15, wherein a width of the at least one second active bonding via is larger than a width of the second dummy bonding vias.

17. The semiconductor structure according to claim 14, wherein a width of the at least one first active bonding via is substantially the same as a width of the at least one second active bonding via.

18. The semiconductor structure according to claim 14, wherein a width of the at least one first active bonding via is larger than a width of the first dummy bonding vias.

19. The semiconductor structure according to claim 14, wherein a surface of the at least one first active bonding via is substantially coplanar with surfaces of the first dummy bonding vias.

20. The semiconductor structure according to claim 14, wherein the first die comprises at least one first conductive feature and a plurality of first dummy features electrically isolated from the at least one first conductive feature, the at least one first active bonding via is in direct contact with the at least one first conductive feature, and the first dummy bonding vias are in direct contact with the first dummy features respectively.

* * * * *